US006177815B1

United States Patent
Baumgartner et al.

(10) Patent No.: US 6,177,815 B1
(45) Date of Patent: Jan. 23, 2001

(54) HIGH BANDWIDTH MEAN ABSOLUTE VALUE SIGNAL DETECTOR WITH HYSTERESIS AND TUNABILITY

(75) Inventors: Steven John Baumgartner, Zumbro Falls; Anh Duy Ngo, Rochester; David Warren Siljenberg, Byron, all of MN (US)

(73) Assignee: International Business Machines Corporation, Armonk, NY (US)

( * ) Notice: Under 35 U.S.C. 154(b), the term of this patent shall be extended for 0 days.

(21) Appl. No.: 09/396,989

(22) Filed: Sep. 15, 1999

(51) Int. Cl.[7] ............................ H03K 5/22; H03K 5/153
(52) U.S. Cl. ................................ 327/76; 327/74
(58) Field of Search ............................ 327/76, 75, 74, 327/65, 354

(56) References Cited

U.S. PATENT DOCUMENTS 3,797,305 * 3/1974 Ginns Haskell ..................... 73/1.11
5,498,985 * 3/1996 Parle et al. ............................ 327/76
5,856,750 * 1/1999 Koseki .................................. 327/76

* cited by examiner

Primary Examiner—Terry D. Cunningham
Assistant Examiner—Long Nguyen
(74) Attorney, Agent, or Firm—Joan Pennington

(57) ABSTRACT

A improved signal detector is provided. The signal detector includes a linear amplifier receiving the input signal and providing an amplified signal. A full-wave rectifier is coupled to the linear amplifier and provides a rectified signal. A low-pass filter is coupled to the full-wave rectifier receiving the rectified signal and providing a comparing signal. A high threshold reference and a low threshold reference respectively is applied to a first comparator and a second comparator, each receiving the comparing signal. The first comparator and the second comparator respectively provide a first compared signal and a second compared signal. A reference path providing the high threshold reference and the low threshold reference includes a linear amplifier, a full-wave rectifier and a low-pass filter providing the high threshold reference. A linear charge pump is connected at its input to the linear amplifier and connected at its output to a low-pass filter to provide the low threshold reference.

13 Claims, 1 Drawing Sheet

HIGH BANDWIDTH MEAN ABSOLUTE VALUE SIGNAL DETECTOR WITH HYSTERESIS AND TUNABILITY

FIELD OF THE INVENTION

The present invention relates to signal detectors, and more particularly, to a high bandwidth mean absolute value signal detector with hysteresis and tunability.

DESCRIPTION OF THE RELATED ART

A signal detector is used in the receiver section of an optical connection to indicate a loss of signal to the host system. As technology advances, demands are high for a signal detector that can operate with low power supply voltage, high bandwidth, better noise rejection, wide tuning range, temperature independence, and hysteresis.

Most parts now in the industry are striving for low power supply voltage which drives the demand for a 3.3v signal detector. High bandwidth is required to satisfy the 1.25 Gbit Ethernet requirement. Better noise rejection is needed to provide less chance for the output of the signal detector to chattered, thus providing a more reliable signal detector output. Due to the wide variations of the SNR of the preamp, a wide tuning range is needed to keep the threshold above the noise floor. Temperature independence is needed to insure a constant threshold regardless of present temperature. Hysterisis is needed to reduce the chance of chatter.

A need exists for an improved signal detector. It is desirable to provide an improved high bandwidth mean absolute value signal detector with hysteresis and tunability.

SUMMARY OF THE INVENTION

A principal object of the present invention is to provide an improved signal detector. Other objects of the invention are to provide such signal detector with hysteresis and tunability; to provide such signal detector substantially without negative effect and that overcome many of the disadvantages of prior art arrangements.

In brief, an improved signal detector is provided. The signal detector includes a linear amplifier receiving the input signal and providing an amplified signal. A full-wave rectifier is coupled to the linear amplifier and provides a rectified signal. A low-pass filter is coupled to the full-wave rectifier receiving the rectified signal and providing a comparing signal. A high threshold reference and a low threshold reference respectively is applied to a first comparator and a second comparator, each receiving the comparing signal. The first comparator and the second comparator respectively provide a first compared signal and a second compared signal.

In accordance with features of the invention, a reference path providing the high threshold reference and the low threshold reference includes a linear amplifier, a full-wave rectifier and a low-pass filter providing the high threshold reference. The linear amplifier, full-wave rectifier and low-pass filter in the reference path is matched with the signal path. A linear charge pump is connected at its input to the linear amplifier and connected at its output to a low-pass filter to provide the low threshold reference.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
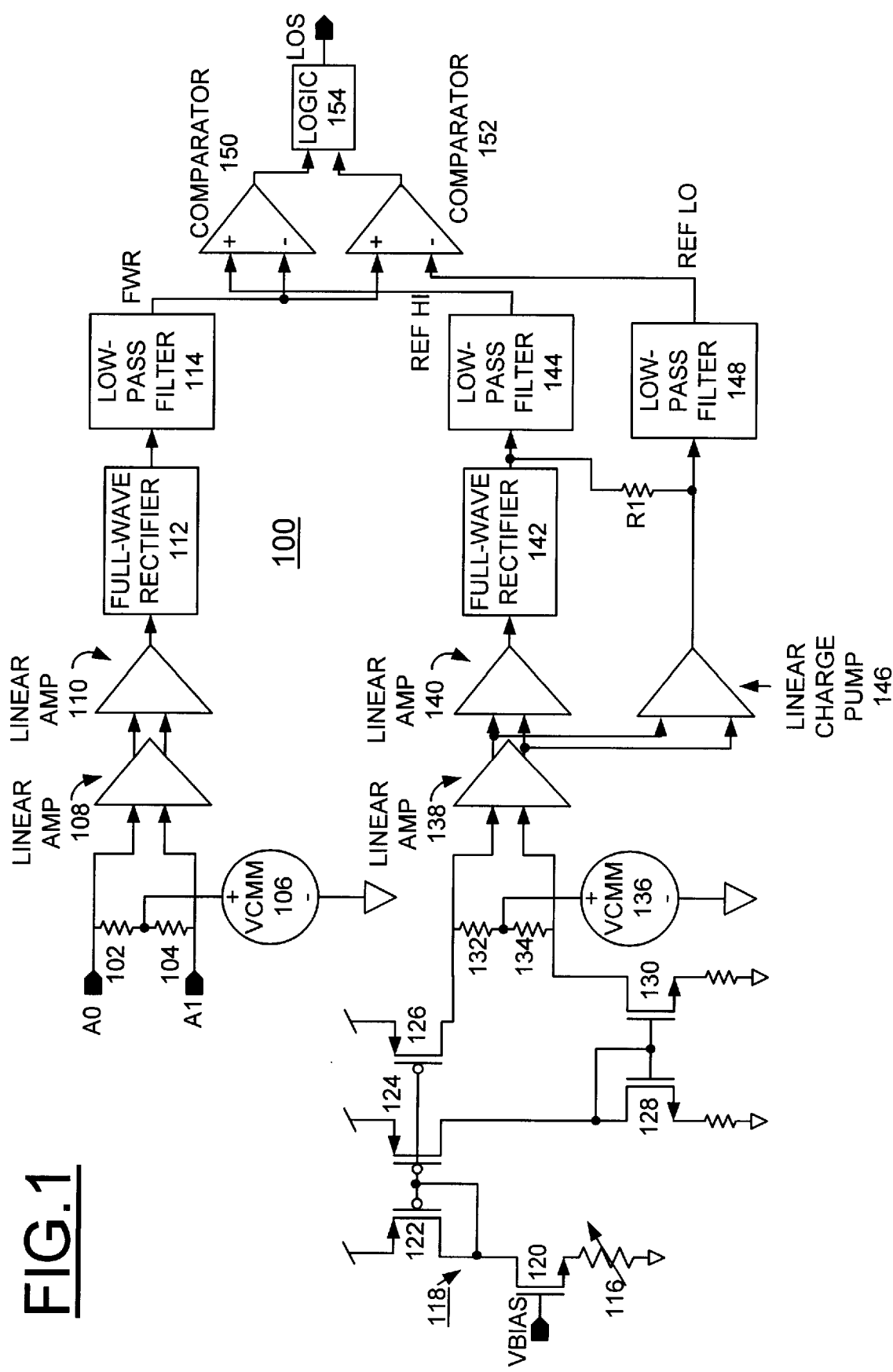
FIG. 1 is a schematic diagram representation of a high bandwidth signal detector with hysteresis and tunability of the preferred embodiment.

Referring now to FIG. 1, there is shown a signal detector generally designated by 100 and arranged in accordance with the preferred embodiment. Signal detector 100 provides high bandwidth, hysteresis and tunability. An input signal is applied to inputs A0, A1 of the signal detector 100. A pair of series connected resistors 102 and 104 are connected between the inputs AO, Al with a voltage source VCMM 106 connected between the junction of resistors 102 and 104 and ground. The signal detector 100 of the preferred embodiment includes a pair of linear amplifiers 108, 110 providing an amplified signal. A full-wave rectifier 112 receives the amplified signal and provides a full-wave rectified signal. A low-pass filter 114 receives the rectified signal and provides a low-pass filtered signal. The linear amplifiers 108,110, full-wave rectifier 112 and low-pass filter 114 are connected in series to amplify and average out the detected signal. In addition, the noise is averaged out, which will give the signal detector a better noise rejection, guaranteed hysteresis, and a more reliable signal detector output. Signal detector 100 using the full-wave rectifier with low-pass filter techniques is more noise resistant without requiring a large hysteresis.

A potentiometer 116 and a mirror network 118 is used to generate the reference voltage for the threshold and to provide tunability to the signal detector 100. Current mirror 118 includes an N-channel field effect transistor (NFET) 120 receiving a VBIAS input at its gate and connected between a P-channel field effect transistor (PFET) 122. A gate of a pair of PFETs 124 and 126 is connected to the gate of PFET 122 and to the drain of PFET 122 and to the drain of NFET 120. A pair of NFETs 128 and 130 have gates connected together and to the drain of PFET 124. A pair of series connected resistors 132 and 134 are connected between the PFET 126 and NFET 130 with a VCMM 136 connected between the junction of resistors 132 and 134 and ground. The PFET 126 is connected to a first input of the linear amplifier 138 and the NFET 130 is connected to a second input of the linear amplifier 138. The reference voltage generator includes two linear amplifiers 138,140, a full-wave rectifier 142, and a low-pass filter 144 to generate threshold REF HI at the output of the low-pass filter 144. Signal detector 100 allows the comparing signal FWR and the threshold reference REF HI to track each other perfectly with the variation of temperature, power supply voltage, and process. The close tracking of FWR and REF HI insures the constant threshold switch point regardless of the present temperature. The lower threshold REF LO is generated using a linear charge pump 146 to sense the change in voltage level, due to change in temperature, new threshold setting, or the like, of the upper threshold REF HI. Once the charge pump 146 senses the change in voltage level of the upper threshold it will automatically adjust the current through R1 to keep the hysteresis constant. A low-pass filter 148 coupled to the charge pump 146 is also used for better tracking. Two identical CMOS comparators 150, 152 compare FWR with REF HI and REF LO to output the appropriate logic signals. The comparator output signals are applied to a logic block 154 to output the detecting result LOS.

While the present invention has been described with reference to the details of the embodiments of the invention shown in the drawing, these details are not intended to limit the scope of the invention as claimed in the appended claims.

What is claimed is:

1. A signal detector comprising:

an input signal;

a linear amplifier receiving said input signal and providing an amplified signal;

a full-wave rectifier coupled to said linear amplifier and providing a rectified signal;

a low-pass filter coupled to said full-wave rectifier receiving said rectified signal and providing a comparing signal;

a high threshold reference;

a low threshold reference;

a first comparator receiving said comparing signal and said high threshold reference and providing a first compared signal; and a second comparator receiving said comparing signal and said low threshold reference and providing a second compared signal.

2. A signal detector as recited in claim 1 wherein said linear amplifier includes a first linear amplifier and a second linear amplifier coupled to said first linear amplifier.

3. A signal detector as recited in claim 1 includes a logic block coupled to both said first comparator and said second comparator, said logic block providing a detected signal output.

4. A signal detector as recited in claim 1 includes a second linear amplifier receiving a bias input and providing an amplified bias signal; a second full-wave rectifier coupled to said linear amplifier receiving said amplified bias signal and providing a rectified signal; and a second low-pass filter coupled to said full-wave rectifier receiving said rectified signal and providing said high threshold reference.

5. A signal detector as recited in claim 4 wherein said second linear amplifier includes a pair of linear amplifier connected in series.

6. A signal detector as recited in claim 4 further includes a linear charge pump coupled to said second linear amplifier and a low-pass filter coupled to an output of said charge pump providing said low threshold reference.

7. A signal detector as recited in claim 6 further includes a resistor connected between said charge pump output and an output of said full-wave rectifier.

8. A signal detector as recited in claim 1 wherein said first comparator and said second comparator are identical devices.

9. A signal detector as recited in claim 1 includes a mirror circuit and a potentiometer for generating said high threshold reference and said low threshold reference.

10. A signal detector comprising:

a signal path receiving a signal input, said signal path including
a first linear amplifier coupled to a second linear amplifier; a full-wave rectifier coupled to said second linear amplifier; and a low-pass filter coupled to said full-wave rectifier; said low-pass filter providing a comparing signal;

a reference path receiving a bias input, said reference path including a third linear amplifier coupled to a fourth linear amplifier; a second full-wave rectifier coupled to said fourth linear amplifier; and a second low-pass filter coupled to said second full-wave rectifier; said second low-pass filter providing a high threshold reference;

a linear charge pump coupled to an output of said third linear amplifier and a third low-pass filter coupled to said linear charge pump; said third low-pass filter providing a low threshold reference;

a first comparator receiving said comparing signal and said high threshold reference and providing a first compared signal;

a second comparator receiving said comparing signal and said low threshold reference and providing a second compared signal; and a logic block coupled to both said first comparator and said second comparator, said logic block providing a detected signal output.

11. A signal detector as recited in claim 10 further includes a resistor connected between an output of said charge pump and said second full-wave rectifier.

12. A signal detector as recited in claim 10 wherein said first comparator and said second comparator are identical devices.

13. A signal detector as recited in claim 10 includes a mirror circuit and a potentiometer for generating said bias input to said reference path.

* * * * *